(12) United States Patent
Jianqin

(10) Patent No.: US 6,321,076 B1
(45) Date of Patent: Nov. 20, 2001

(54) 90° PHASE SHIFTER AND IMAGE REJECTION MIXER

(75) Inventor: Wang Jianqin, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/353,357

(22) Filed: Jul. 15, 1999

(30) Foreign Application Priority Data

Jul. 17, 1998 (JP) .................................................. 10-203486

(51) Int. Cl.$^7$ ...................................................... A04B 1/26
(52) U.S. Cl. ......................... 455/323; 455/326; 375/279; 375/280
(58) Field of Search ............................ 455/323, 326, 455/302, 304, 305, 313, 131, 189.1, 314; 375/268, 272, 273, 274, 275, 279, 281, 280

(56) References Cited

U.S. PATENT DOCUMENTS

| 5,901,349 | * | 5/1999 | Guegnaud et al. | 455/302 |
| 5,912,975 | * | 11/2000 | Schott | 381/1 |
| 6,029,059 | * | 2/2000 | Bojer | 455/326 |
| 6,081,697 | * | 6/2000 | Haartsen | 455/109 |
| 6,151,313 | * | 11/2000 | Abramson | 370/342 |

FOREIGN PATENT DOCUMENTS

| 3-26012 | 2/1991 | (JP) . |
| 3-60206 | 3/1991 | (JP) . |
| 5-68065 | 3/1993 | (JP) . |
| 6232925 | 8/1994 | (JP) . |
| 7-183929 | 7/1995 | (JP) . |
| 8-130416 | 5/1996 | (JP) . |
| 9-93080 | 4/1997 | (JP) . |
| 9-98067 | 4/1997 | (JP) . |

* cited by examiner

Primary Examiner—William Trost
Assistant Examiner—Congvan Tran
(74) Attorney, Agent, or Firm—Sughrue, Mion, Zinn, Macpeak & Seas, PLLC

(57) ABSTRACT

A phase shift circuit includes a first phase shifter, second phase shifter, and adder. The first phase shifter receives an input signal and obtains first and second intermediate phase shift signals having different phases. The second phase shifter obtains first and second outputs by shifting phases of the first and second intermediate phase shift signals. The adder generates a phase shift output signal by adding the first and second outputs from the second phase shifter. A phase shifting device, oscillation circuit, and image rejection mixer are also disclosed.

40 Claims, 11 Drawing Sheets

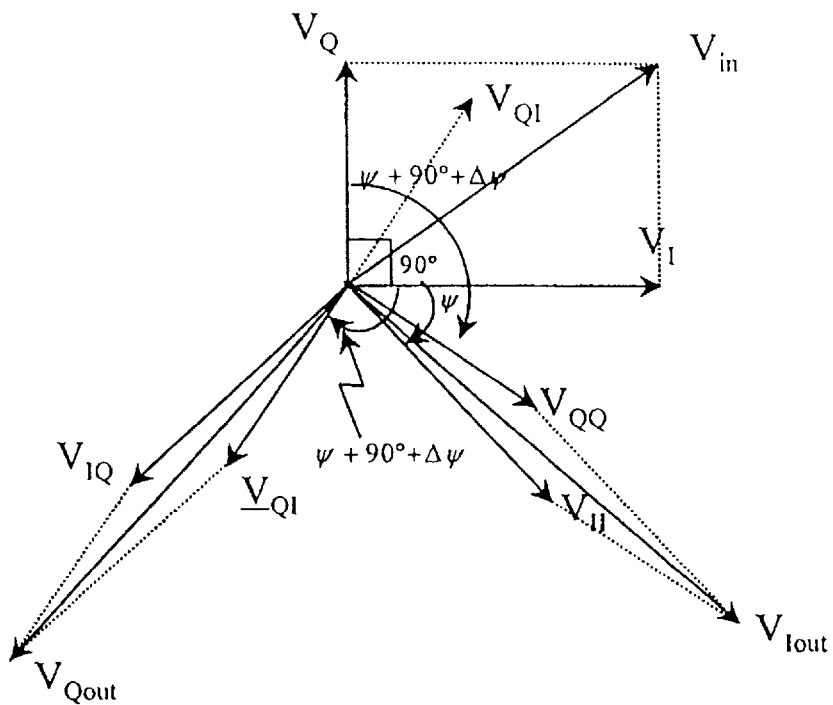
FIG. 3
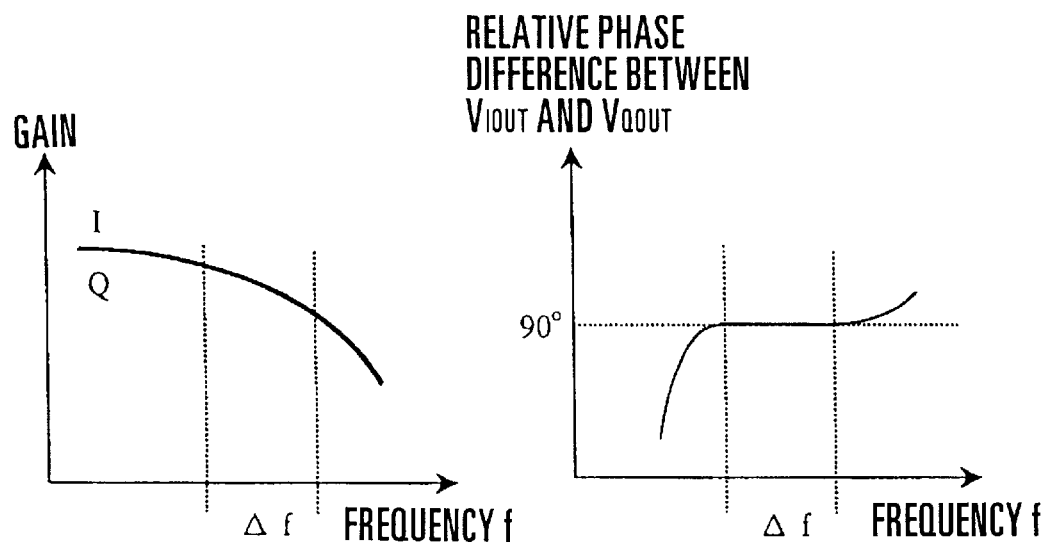
FIG. 4A
FIG. 4B

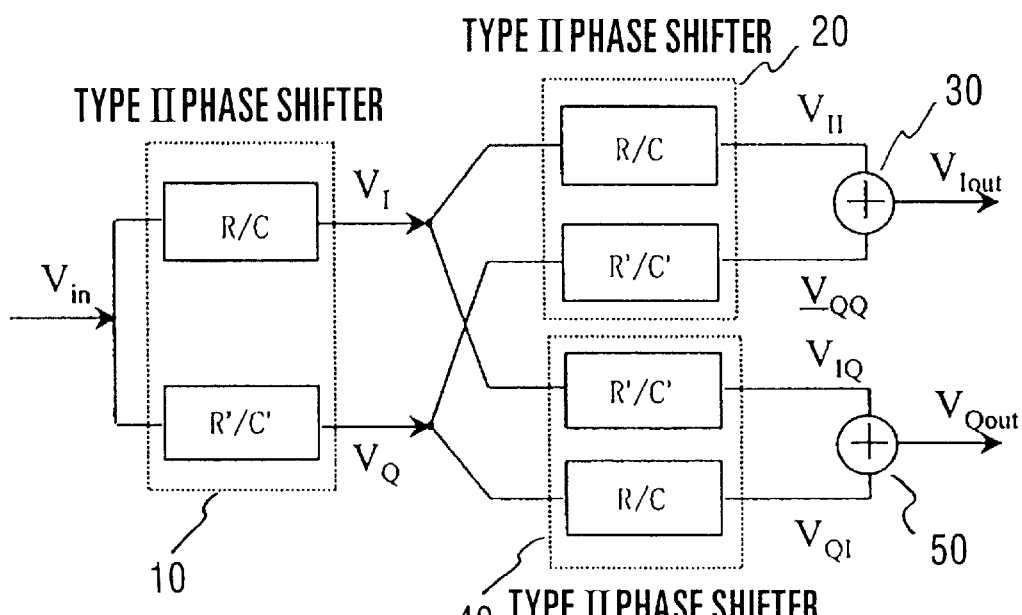
F I G. 9
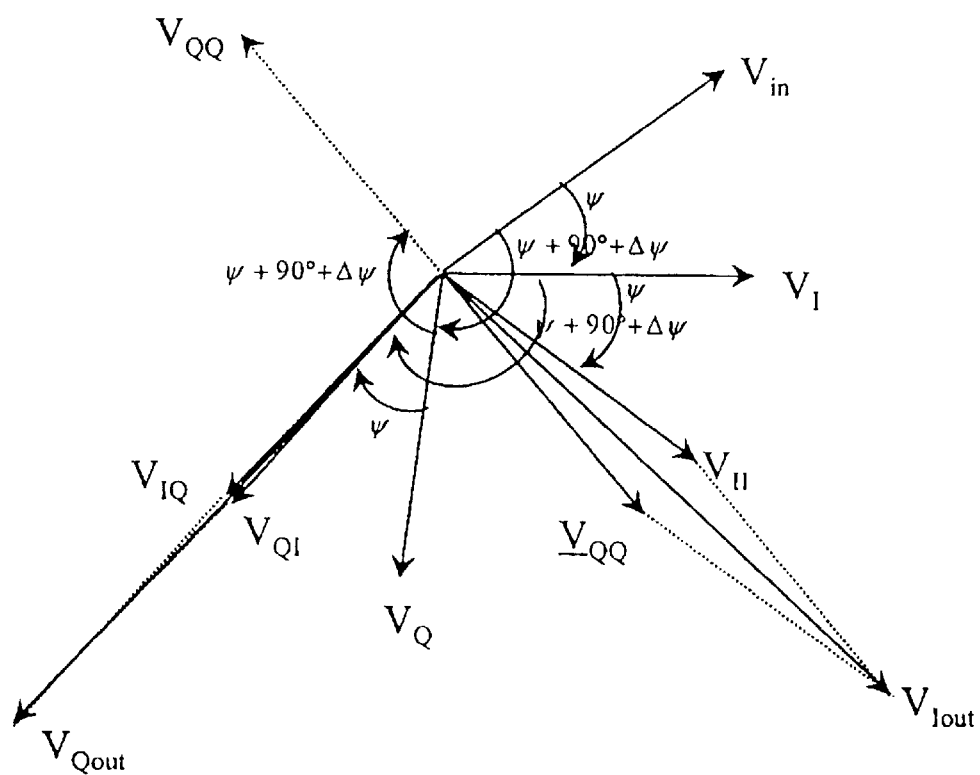
F I G. 10

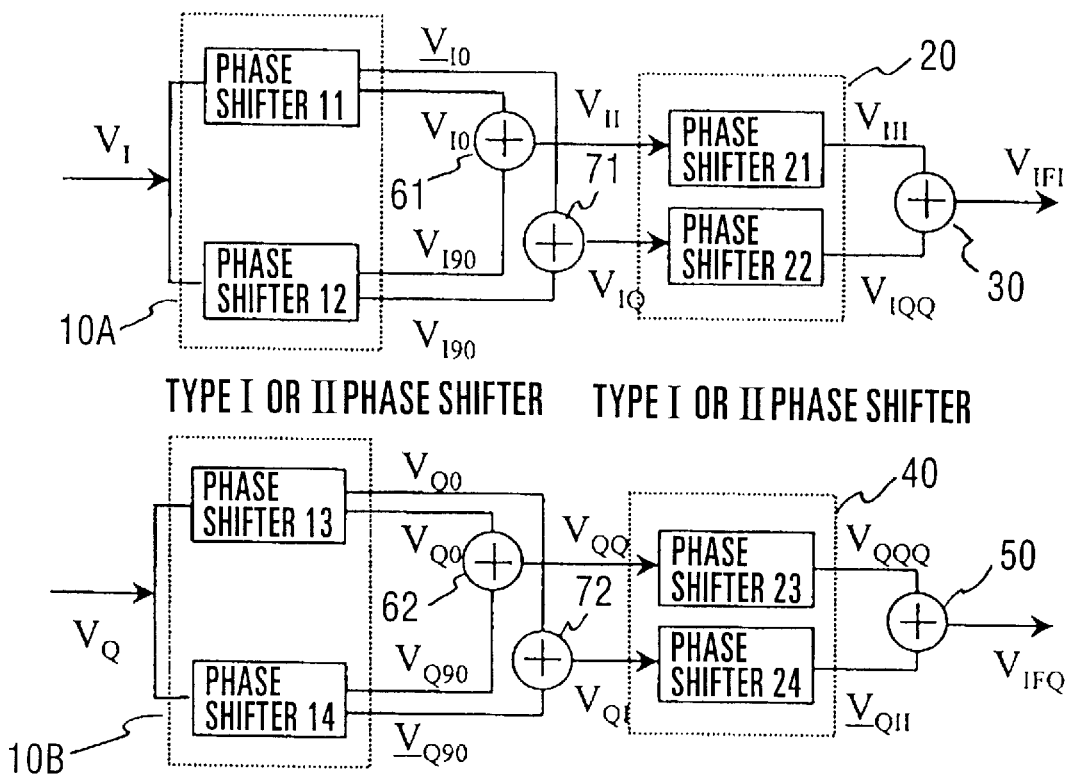
F I G. 17
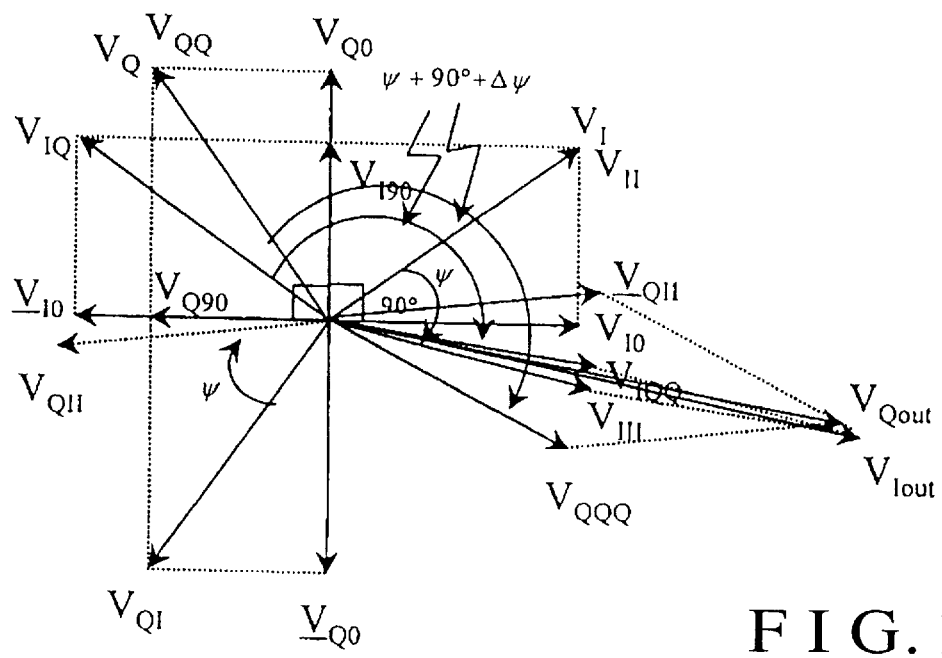
F I G. 18

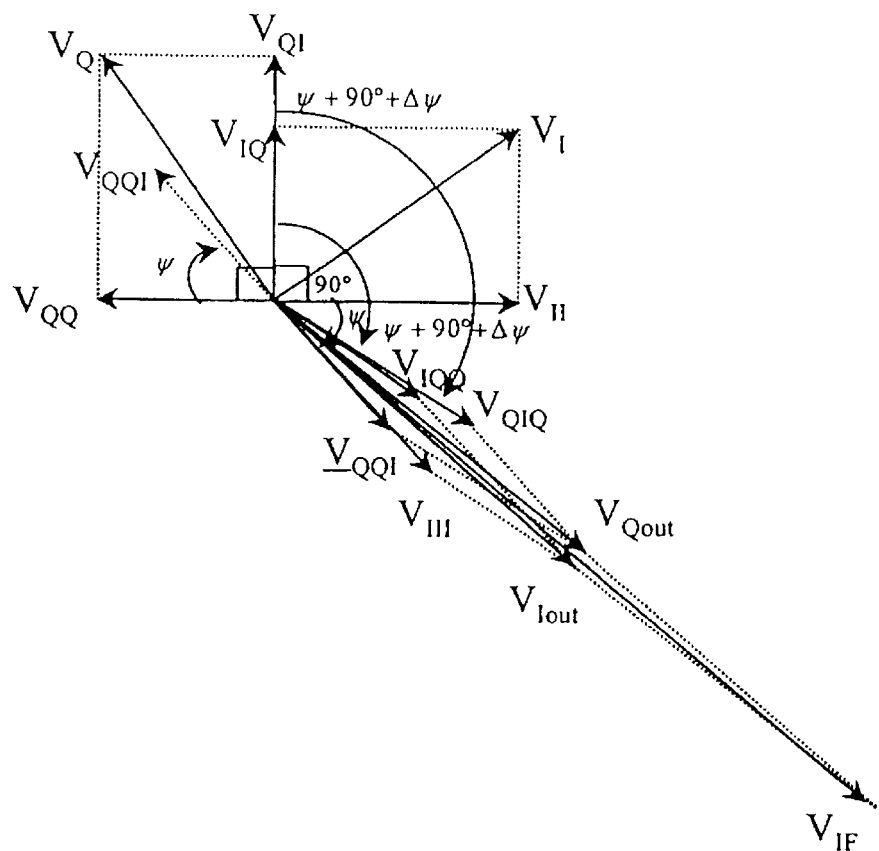
F I G. 20
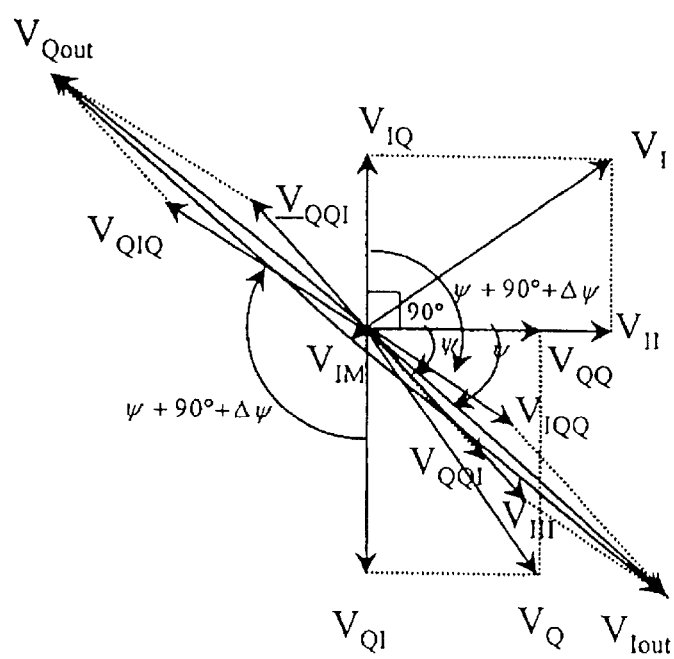
F I G. 21

90° PHASE SHIFTER AND IMAGE REJECTION MIXER

BACKGROUND OF THE INVENTION

The present invention relates to a phase shift circuit suitably used for a device required to generate signals having a specific phase difference and substantially the same amplitude.

A phase shift circuit is designed to shift the phase of an input signal on the basis of the phase shift characteristics of the circuit and output the resultant signal, and has various applications including an image rejection mixer circuit.

Phase shifters used in an image rejection mixer should be designed without phase error and amplitude error to get highest image rejection rate. However, the actual phase and amplitude of a phase shift output signal considerably differ from target values owing to an input signal frequency deviation from the center frequency in the phase shift circuit or variations in the constants of elements constituting the circuit from design values.

For this reason, the image signal is not satisfactorily rejected owing to the phase and/or amplitude error of a 90° phase shifter.

Under the circumstances, the amplitude difference between phase shift output signals is detected and corrected, or the phase difference between the signals is detected to control the phase shift characteristics of the phase shifting device.

For example, Japanese Patent Laid-Open No. 3-60206 (FIG. 11, in particular) and Japanese Patent Laid-Open No. 8-130416 (FIG. 5, in particular) disclose the former method. Japanese Patent Laid-Open No. 3-60206 (FIG. 10, in particular) discloses the latter method.

According to the former method, however, if an amplitude error is corrected by feed forward control, a power detection circuit itself must be corrected to perfectly correct the amplitude error. This poses a problem in term of design.

In addition, when an amplitude error is corrected by feedback control, the amplitude error cannot be perfectly corrected, thus producing a steady error.

More specifically, although an amplitude difference approaches 0 by loop control, the amplitude difference changes to the positive side after it passes 0. When control is performed to return the amplitude difference on the positive side to 0 again, the amplitude difference changes to the negative side. By repeating this operation, the amplitude difference finally stays within a certain error range (steady error).

According to the latter method, since a phase error is corrected by feedback control, the phase error cannot be perfectly corrected, and a steady error is produced, as in the case of feedback control for an amplitude error.

SUMMARY OF THE INVENTION

The present invention has been made to solve the above problems, and has as its object to provide an improved phase shift circuit.

It is another object of the present invention to provide a phase shift circuit with almost no phase error and amplitude error throughout a wide frequency range.

It is still another object of the present invention to provide a phase shift circuit suitably used for a phase shifting device for generating two signals having a specific phase difference relationship and substantially the same amplitude without detecting the phases and/or amplitudes of the signals after phase shifting operation.

In order to achieve the above objects, according to the present invention, there is provided a phase shift circuit comprising a first phase shifter for receiving an input signal and obtaining first and second intermediate phase shift signals having different phases, a second phase shifter for obtaining first and second outputs by shifting phases of the first and second intermediate phase shift signals, and an adder for generating a phase shift output signal by adding the first and second outputs from the second phase shifter.

BRIEF DESCRIPTION OF THE DRAWINGS

FIG. 3 is a vector diagram of the respective signals to explain the operation of this phase shifting device;

FIGS. 4A and 4B are graphs showing the phase shift characteristics of this phase shifting device;

FIG. 9 is a block diagram showing a phase shifting device according to the third embodiment of the present invention;

FIG. 10 is a vector diagram of the respective signals to explain the operation of this phase shifting device;

FIG. 17 is a block diagram showing a phase shifting device according to the seventh embodiment of the present invention;

FIG. 18 is a vector diagram of the respective signals to explain the operation of this phase shifting device;

FIG. 20 is a vector diagram showing the output state of a signal $V_{IF}$ from this image rejection mixer; and FIG. 21 is a vector diagram showing the output state of a signal $V_{IM}$ from this image rejection mixer.

DESCRIPTION OF THE PREFERRED EMBODIMENT

The embodiments of the present invention will be described in detail below with reference to the accompanying drawings to clarify the above objects, other objects, features, and effects of the present invention.

[First Embodiment]

Figure 1:
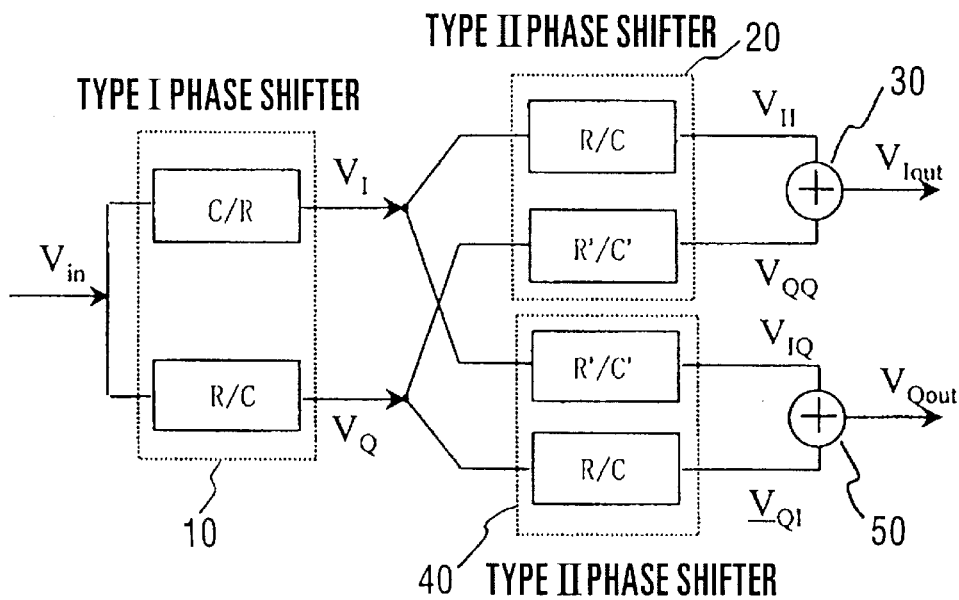
FIG. 1 is a block diagram showing a phase shifting device according to the first embodiment of the present invention.

FIG. 1 shows the first embodiment of the present invention. In this embodiment, a phase shift circuit according to the present invention is applied to a phase shifting device for executing phase shifting operation for an input signal $V_{in}$ to generate two output signals $V_{Iout}$ and $V_{Qout}$ having a phase difference of 90° and substantially the same amplitude.

This phase shifting device can therefore be applied to a circuit for obtaining two LOC (local oscillation frequency) signals having a phase difference of 90° in the above demodulation circuit for quadrature phase modulation.

The input signal $V_{in}$ is supplied to a first phase shifter 10. As a consequence, signals $V_I$ and $V_Q$ are obtained as intermediate phase shift signals. The phases of these signals are further shifted by a second phase shifter 20 to obtain signals $V_{II}$ and $V_{QQ}$.

An adder 30 adds the two signals $V_{II}$ and $V_{QQ}$. The resultant signal is output as the phase shift output signal $V_{Iout}$. This arrangement is the basic arrangement of a phase shift circuit of the present invention.

To obtain the signal $V_{Qout}$ that is 90° out of phase with the signal $V_{Iout}$ and has substantially the same amplitude as that thereof, a third phase shifter 40 further executes phase shifting operation for the intermediate phase shift signals $V_I$ and $V_Q$ to generate signals $V_{IQ}$ and $V_{\_QI}$ (the underlined "V" in FIG. 1 is equivalent to "V_" in this specification, which indicates an inverted signal of the signal $V_{QI}$).

An adder 50 adds/synthesizes these signals $V_{IQ}$ and $V_{\_QI}$ to output the resultant signal as the signal $V_{Qout}$.

In this embodiment, a type I phase shifter is used as the first phase shifter 10, and type II phase shifters are used as the second and third phase shifters 20 and 40.

Figure 5:
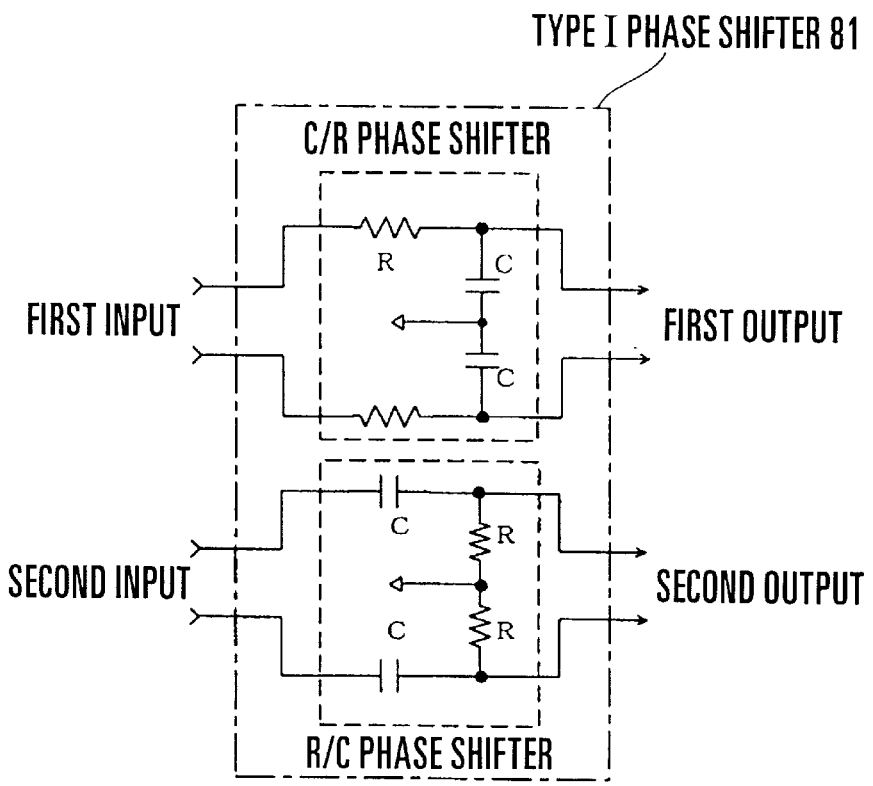
FIG. 5 is a circuit diagram showing the circuit arrangement of a type I phase shifter.

A type I phase shifter 81 (see FIG. 5) has a C/R phase shifter and R/C phase shifter. These phase shifters are made up of resistors and capacitors and connected to each other as shown in FIG. 5. The type I phase shifter has the advantage of keeping the relative phase difference between input and output signals substantially constant against changes in input signal frequency in a wide range. On the other hand, the relative gain of this phase shifter is highly frequency-dependent.

Figure 6:
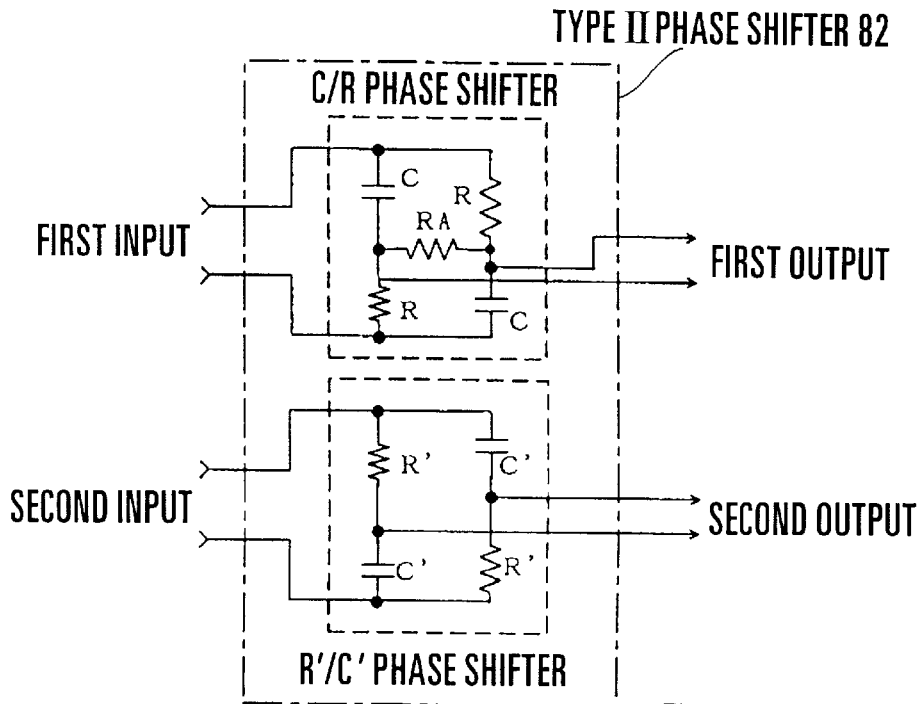
FIG. 6 is a circuit diagram showing the circuit arrangement of a type II phase shifter.

A type II phase shifter 82 (see FIG. 6) has an R/C phase shifter and R'/C' phase shifter. These phase shifters are also made up of resistors and capacitors and connected to each other as shown in FIG. 6. The type II phase shifter has the advantage of keeping the relative gains of input and output signals substantially constant against changes in input signal frequencies in a wide range. On the other hand, the relative phase difference of these signals changes with changes in frequency.

Figure 2:
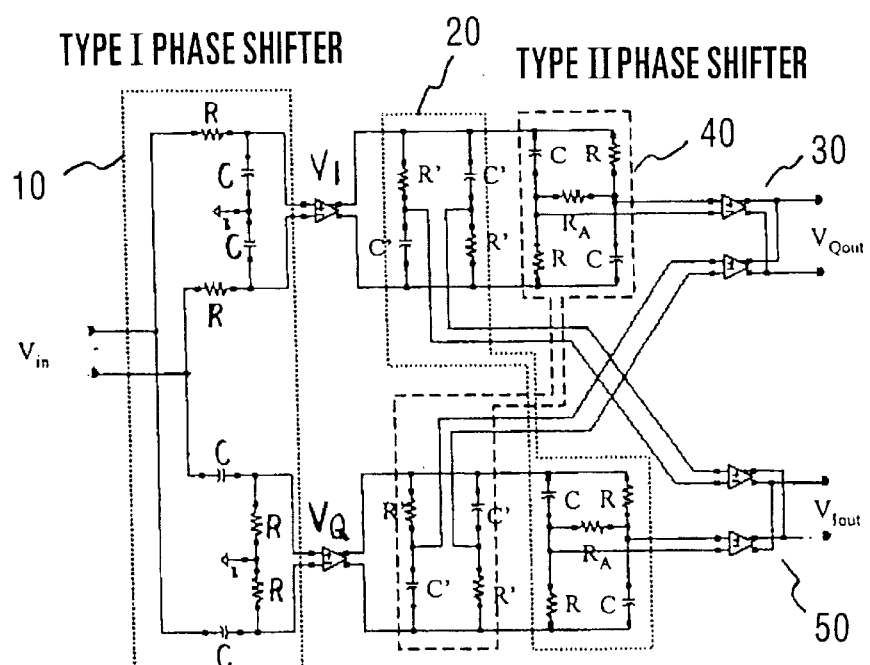
FIG. 2 is an equivalent circuit diagram of this phase shifting device using type I and II phase shifters.

FIG. 2 shows an actual equivalent circuit of the phase shifting device in FIG. 1 which is formed by using these type I and II phase shifters. Since the input signal $V_{in}$ is commonly supplied to the C/R phase shifter and R/C phase shifter of the type I phase shifter 10, one pair of input terminals of the two phase shifters are commonly connected. The signal $V_{in}$ is supplied to the common input terminal. The signals $V_I$ and $V_Q$ are also supplied to the type II phase shifters 20 and 40 through buffer amplifiers, respectively. The outputs from these phase shifters are then added by the adders 30 and 50 serving as wired OR through buffer amplifiers to obtain the output signals $V_{Iout}$ and $V_{Qout}$.

The operation of this phase shifting device can be easily understood with reference to a vector diagram of the respective signals shown in FIG. 3. More specifically, since the phase angles of the C/R and R/C phase shifters of the type I phase shifter 10 are set to 45°, the phase difference between the signals $V_I$ and $V_Q$ is 90°. This phase difference remains substantially constant regardless of the frequency of the signal $V_{in}$. On the other hand, these signals have different amplitudes.

The signal $V_I$ is phase-shifted through 45° clockwise in FIG. 3 at the point of the center frequency to become the signal $V_{II}$. As described above, this signal has a deviation.

The R'/C' phase shifter of the phase shifter 20 shifts the phase of the signal $V_Q$ through 135° clockwise at the point of the center frequency in this embodiment to generate the signal $V_{QQ}$. This signal can have a phase deviation.

These signals $V_{II}$ and $V_{QQ}$ are added by the adder 30. As a consequence, the phase shift output signal $V_{Iout}$ is generated. With this operation, phase and/or amplitude deviations from preset values in the phase shifters 10 and 20 can be corrected.

The signal $V_I$ is further supplied to the R'/C' phase shifter of the phase shifter 40 and phase-shifted through 135° clockwise to become the signal $V_{IQ}$ in this embodiment. The R/C phase shifter of the phase shifter 40 shifts the phase of the signal $V_Q$ through 45° clockwise to generate the signal $V_{\_QI}$ in this embodiment. As is obvious from the circuit arrangement shown in FIG. 2, the signal $V_{\_QI}$ having an inverted phase to the signal $V_{QI}$ is added to the signal $V_{IQ}$, thus obtaining the signal $V_{Qout}$ having undergone correction of phase and/or amplitude deviations As a consequence, the phase shift output signals $V_{Iout}$ and $V_{Qout}$ have a phase difference of 90° and substantially the same amplitude, as shown in FIG. 3. That is, as shown in FIGS. 4A and 4B, phase characteristics that exhibit an almost constant gain with changes in the frequency of the input signal $V_{in}$ in a wide range and a substantial phase difference of 90° can be obtained.

The effects of this embodiment are further obvious from equations (1) and (2) given below. The signals $V_I$ and $V_Q$ obtained by shifting the phase of the input signal $V_{in}$ using the phase shifter 10:

$$V_I \frac{1}{1+j\omega RC} V_{in} \tag{1}$$

$$V_Q \frac{j\omega RC}{1+j\omega RC} V_{in} \tag{2}$$

Letting $K \cdot \exp(j\Psi)$ be the transfer function of the R/C phase shifter of the type II phase shifter, and $K \cdot \exp(j\Psi + \pi/2 + \Delta\Psi)$ be the transfer function of the R'/C' phase shifter of the type II phase shifter, $$V_{II} = K \cdot V_I \cdot \exp(j\psi) = K \cdot \frac{\exp(j\psi)}{1+j\omega RC}$$

$$V_{QQ} = K \cdot V_Q \cdot \exp\left[j\left(\psi + \frac{\pi}{2} + \Delta\psi\right)\right]$$

$$= K \cdot \frac{\exp\left[j\left(\psi + \frac{\pi}{2} + \Delta\psi\right)\right]}{1+j\omega RC} \cdot j\omega RC \cdot V_{in}$$

$$V_{IQ} = K \cdot V_I \cdot \exp\left[j\left(\psi + \frac{\pi}{2} + \Delta\psi\right)\right]$$

$$= K \cdot \frac{\exp\left[j\left(\psi + \frac{\pi}{2} + \Delta\psi\right)\right]}{1+j\omega RC} \cdot V_{in}$$

$$V_{IQ} = K \cdot V_Q \cdot \exp(j\psi) = K \cdot \frac{\exp(j\psi)}{1+j\omega RC} \cdot j\omega RC \cdot V_{in}$$

where K is a value proportional to the gain, $\Psi$ is an arbitrary angle, and $\Delta\Psi$ is the relative phase error of the type II phase shifter.

As shown in the following equations below, the phase error is very small, and the amplitude error is 0 from a mathematical viewpoint.

$$V_{Iout} = V_{II} + V_{QQ} = K \cdot \exp(j\psi) \cdot \frac{1 - \omega RC \cdot \exp(j\Delta\psi)}{1 + j\omega RC} \cdot V_{in}$$

$$V_{Qout} = V_{IQ} + V_{QI} = K \cdot \exp(j\psi) \cdot \frac{\omega RC + \exp(j\Delta\psi)}{1 + j\omega RC} \cdot V_{in}$$

$$\therefore \frac{V_{Qout}}{V_{Iout}} = j \frac{\omega RC + \exp(j\Delta\psi)}{1 + \omega RC \cdot \exp(j\Delta\psi)}$$

therefore $$\text{Phase Error} = \tan^{-1}\left(\frac{1 - \omega^2 R^2 C^2}{1 + \omega^2 R^2 C^2 + \frac{2\omega RC}{\cos\Delta\psi}} \cdot \tan\Delta\psi\right)$$

$$\text{Amplitude Error} = 20\log\left|\frac{V_{Qout}}{V_{Iout}}\right| = 0 \text{ dB}$$

As described above, according to the present invention, there is provided a phase shift circuit in which since a signal from a first phase shifter is phase-shifted by a second phase shifter, and the resultant signals are added, phase differences and/or amplitude deviations from a desired value are canceled out, thereby realizing phase shift characteristics resistant to the influences of the deviation of an input signal frequency from the center frequency or variations in constituent element constant from a designed value.

A phase shifting device using such a phase shift circuit can therefore generate two phase shift output signals having the same amplitude while maintaining the required relationship in phase difference.

Although special phase shifters need not be used as the first and second phase shifters, CR phase shifters made up of capacitors and resistors, which have a relatively simple circuit arrangement and suited for the formation of an integrated circuit, are preferably used.

In addition, as such phase shifters, a type I phase shifter and type II phase shifter are available. In the type I phase shifter, the relative phase difference between input and output signals is substantially constant against changes in the frequency of the input signal in a wide range, but the relative gain varies with such changes. In contrast to this, according to the type II phase shifter, the relative gain of input and output signals is substantially constant against changes in the frequency of the input signal in a wide range, but the relative phase difference varies with such changes.

Either of the type I and II phase shifters can be used as the first phase shifter, and either of the type I and II phase shifters can be used as the second phase shifter.

[Second Embodiment]

Figure 7:
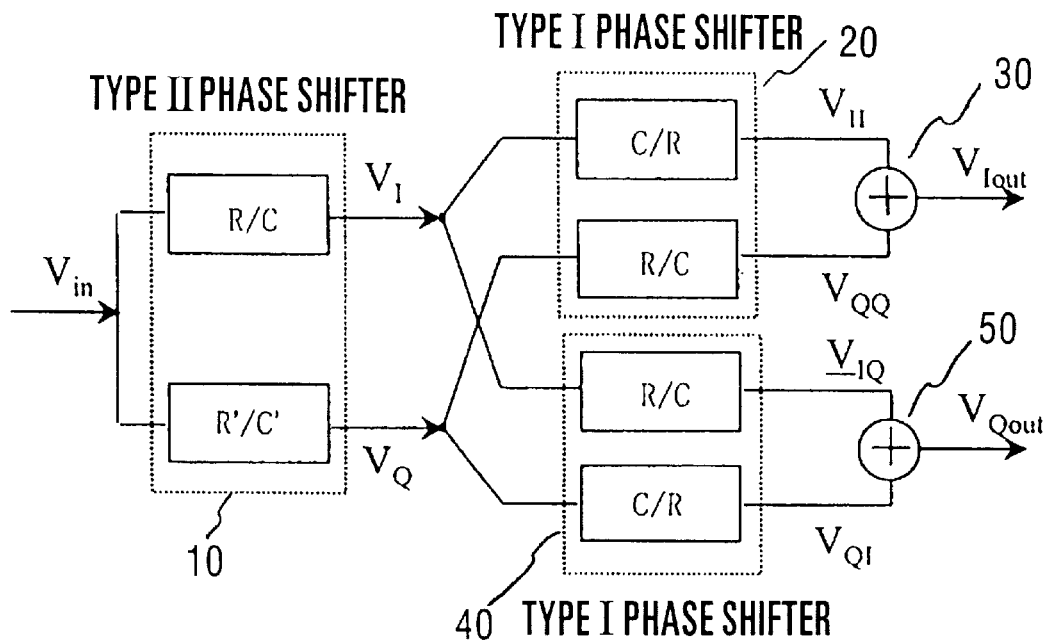
FIG. 7 is a block diagram showing a phase shifting device according to the second embodiment of the present invention.

In the first embodiment, the type I phase shifter is used as the phase shifter 10, and the type II phase shifters are used as the phase shifters 20 and 40. As shown in FIG. 7, however, the type II phase shifter may be used as the phase shifter 10, and the type I phase shifters may be used as the phase shifters 20 and 40.

Figure 8:
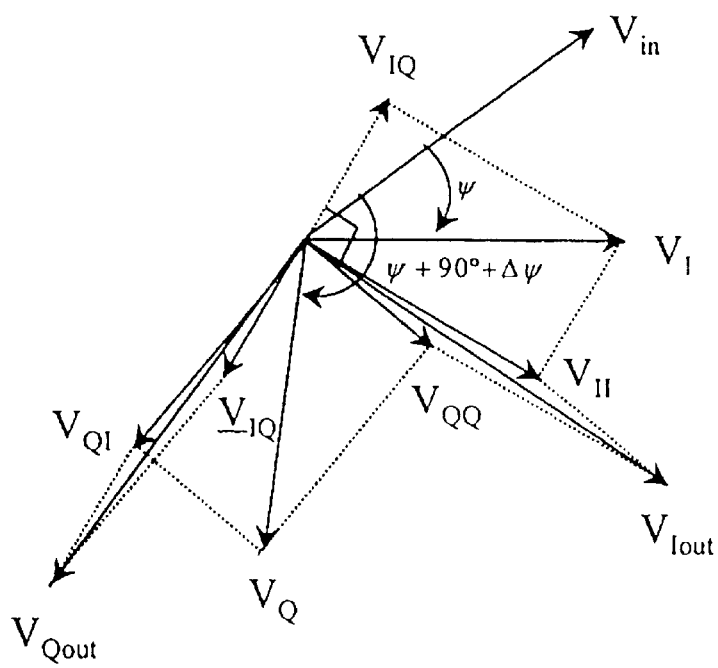
FIG. 8 is a vector diagram of the respective signals to explain the operation of this phase shifting device.

FIG. 8 shows a vector diagram in this case. As is obvious from this vector diagram as well, phase shift output signals $V_{Iout}$ and $V_{Qout}$ have a phase difference of 90° and substantially the same amplitude, thus obtaining phase characteristics that exhibit an almost constant gain with changes in the frequency of an input signal $V_{in}$ in a wide range and a substantial phase difference of 90°.

[Third Embodiment]

As shown in FIG. 9, phase shifters 10, 20, and 40 may be type II phase shifters.

FIG. 10 shows a vector diagram in this case.

As is obvious from this vector diagram as well, phase shift output signals $V_{Iout}$ and $V_{Qout}$ have a phase difference of 90° and substantially the same amplitude, thus obtaining phase characteristics that exhibit an almost constant gain with changes in the frequency of an input signal $V_{in}$ in a wide range and a substantial phase difference of 90°.

[Fourth Embodiment]

Figure 11:
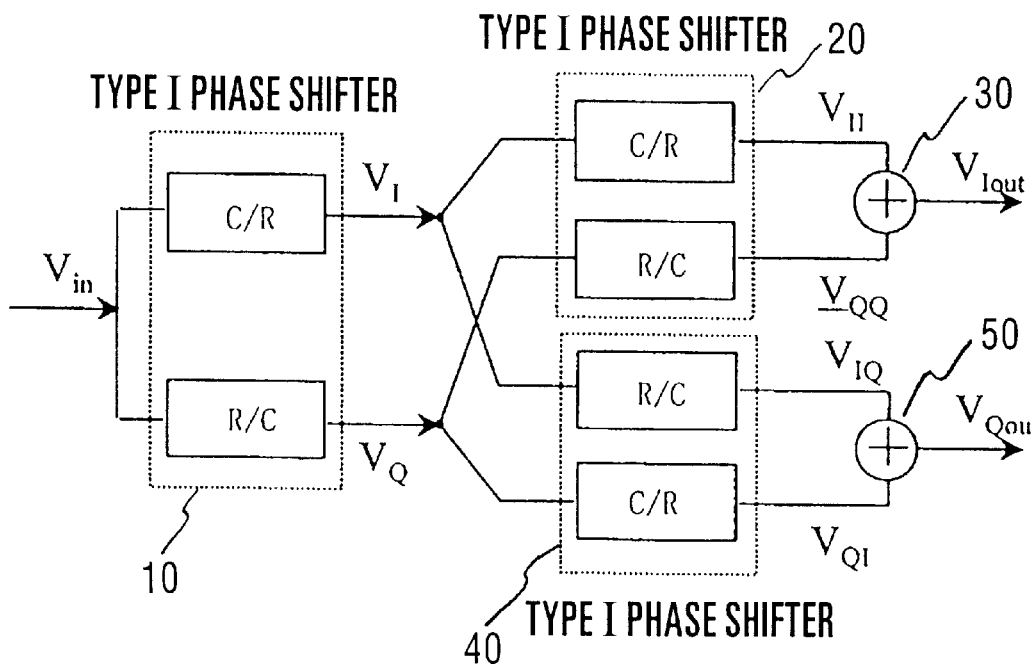
FIG. 11 is a block diagram showing a phase shifting device according to the fourth embodiment of the present invention.

As shown in FIG. 11, phase shifters 10, 20, and 40 may be type I phase shifters.

Figure 12:
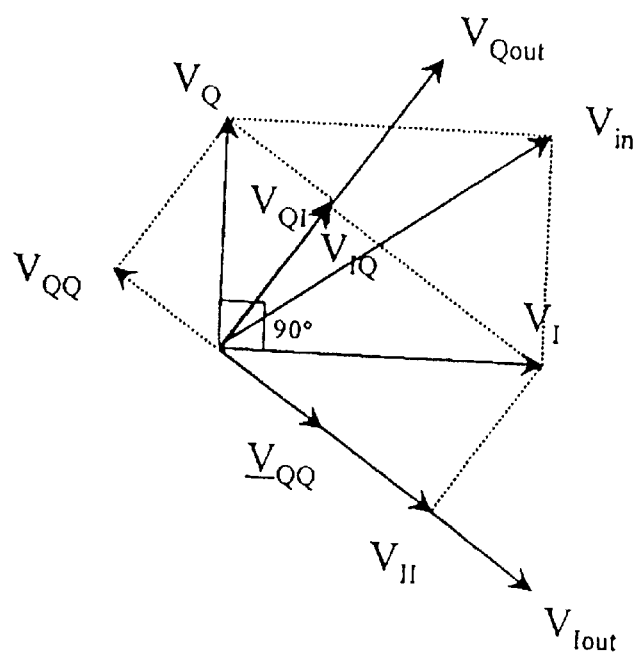
FIG. 12 is a vector diagram of the respective signals to explain the operation of this phase shifting device.

FIG. 12 shows a vector diagram in this case. As is obvious from this vector diagram as well, phase shift output signals $V_{Iout}$ and $V_{Qout}$ have a phase difference of 90° and substantially the same amplitude, thus obtaining phase characteristics that exhibit an almost constant gain with changes in the frequency of an input signal $V_{in}$ in a wide range and a substantial phase difference of 90°.

[Fifth Embodiment]

Figure 13:
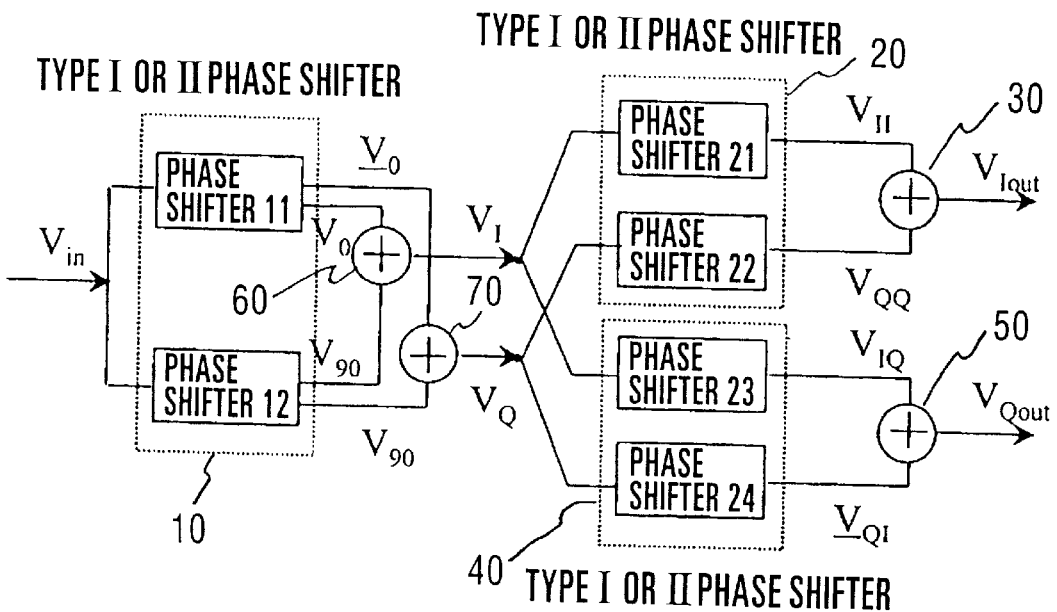
FIG. 13 is a block diagram showing a phase shifting device according to the fifth embodiment of the present invention.

As shown in FIG. 13, type I or II phase shifters may be used as phase shifters 10, 20, and 40. In this arrangement, phase shift signals $V_0$ and $V_{90}$ respectively obtained by phase shifters 11 and 12 constituting the phase shifter 10 may be added by an adder 60 to obtain a signal $V_I$, and a phase shift signal $V_{-0}$ and the phase shift signal $V_{90}$ respectively obtained by the phase shifters 11 and 12 may be added by an adder 70 to obtain a signal $V_Q$.

In this case, the phase shifter 10 includes the adders 60 and 70.

Figure 14:
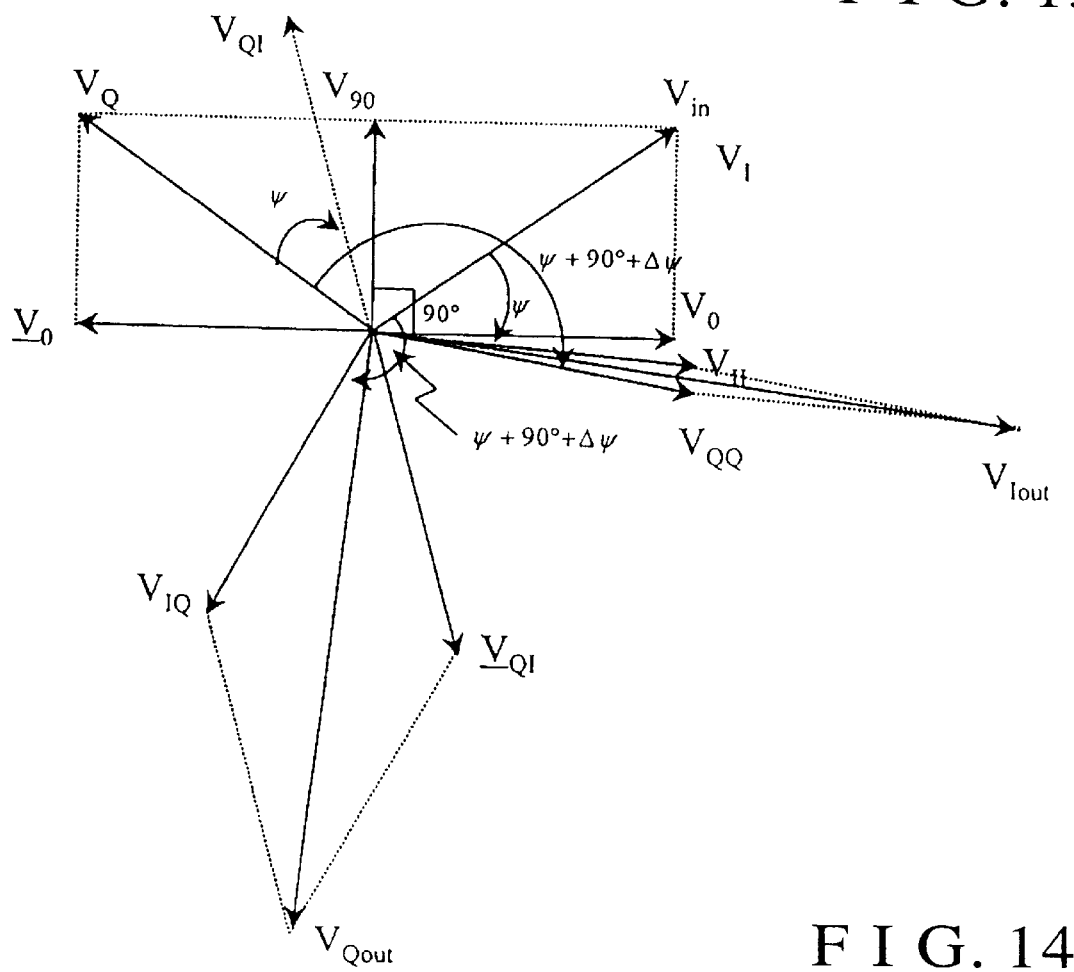
FIG. 14 is a vector diagram of the respective signals to explain the operation of this phase shifting device.

FIG. 14 shows a vector diagram in a case wherein a type I phase shifter is used as the phase shifter 10, and type II phase shifters are used as the phase shifters 20 and 40.

[Sixth Embodiment]

Figure 15:
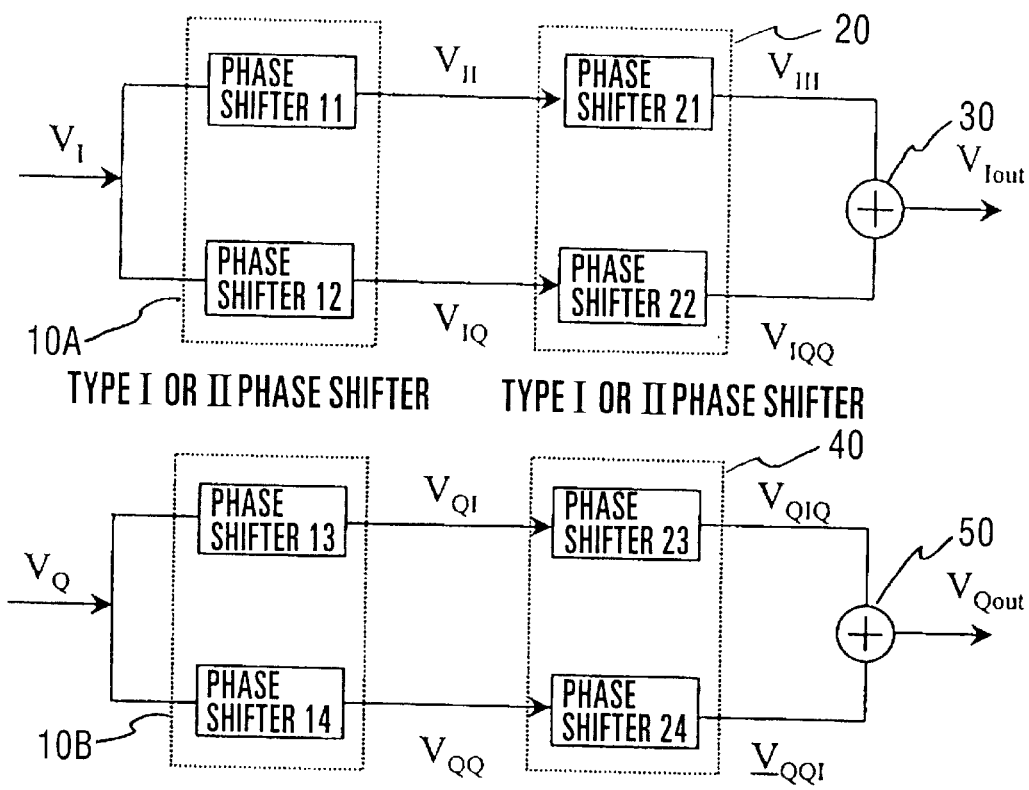
FIG. 15 is a block diagram showing a phase shifting device according to the sixth embodiment of the present invention.

FIG. 15 shows the sixth embodiment of the present invention.

In this embodiment, a phase shift circuit according to the present invention is applied to a phase shifting device for executing phase shifting operation for input signals $V_I$ and $V_Q$ (having a phase difference of 90°) to generate two output signals $V_{Iout}$ and $V_{Qout}$ having a phase difference of 0° and substantially the same amplitude.

This phase shifting device can therefore be applied to an image rejection mixer for removing IM signals in the above demodulation circuit for quadrature phase modulation.

The input signal $V_I$ is supplied to a first phase shifter 10A to obtain signals $V_{II}$ and $V_{IQ}$ as intermediate phase shift signals.

The phases of these signals are further shifted by a second phase shifter 20 to obtain signals $V_{III}$ and $V_{IQQ}$.

An adder 30 then adds the signals $V_{III}$ and $V_{IQQ}$ and outputs the resultant signal as the phase shift output signal $V_{Iout}$.

The input signal $V_Q$ is supplied to a third phase shifter 10B to obtain signals $V_{QI}$ and $V_{QQ}$ as intermediate phase shift signals.

The phases of these signals are further shifted by a fourth phase shifter 40 to obtain signals $V_{QIQ}$ and $V_{-QQI}$.

An adder 50 then adds the signals $V_{QIQ}$ and $V_{-QQI}$ and outputs the resultant signal as the phase shift output signal $V_{Qout}$.

In this embodiment as well, type I or II phase shifters may be used as the phase shifters 10A, 10B, 20, and 40.

Figure 16:
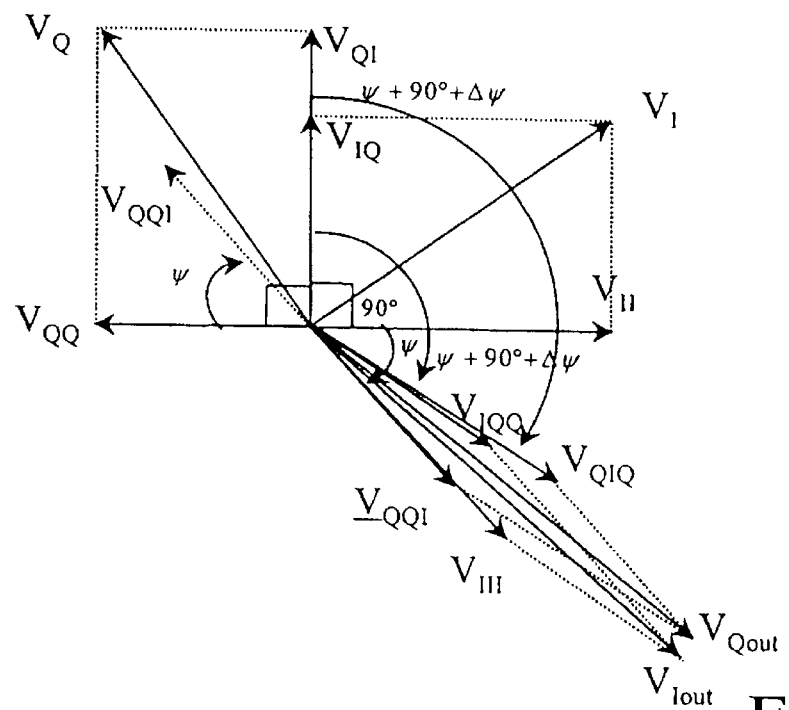
FIG. 16 is a vector diagram of the respective signals to explain the operation of this phase shifting device.

FIG. 16 shows a vector diagram in a case wherein type I phase shifters are used as the phase shifters 10A and 10B, and type II phase shifters are used as the phase shifters 20 and 40.

A phase shifter 11 of the first phase shifter 10A shifts the phase of the signal $V_I$ through 45° clockwise in FIG. 16 at the point of the center frequency to obtain the signal $V_{II}$.

A phase shifter 12 of the first phase shifter 10A shifts the phase of the signal $V_I$ through 45° counterclockwise in FIG. 16 at the point of the center frequency to obtain the signal $V_{IQ}$.

The phase difference between the signals $V_{II}$ and $V_{IQ}$ is 90° and substantially constant regardless of the frequency of the signal $V_I$. These signals, however, have different amplitudes.

In this embodiment, a phase shifter 21 of the phase shifter 20 shifts the phase of the signal $V_{II}$ through 45° clockwise in FIG. 16 at the point of the center frequency to obtain the signal $V_{III}$. As described above, this signal has a deviation.

In this embodiment, a phase shifter 22 of the phase shifter 20 shifts the phase of the signal $V_{IQ}$ through 135° clockwise at the point of the center frequency to generate the signal $V_{IQQ}$.

This signal may also have a phase deviation.

The adder 30 adds these signals $V_{III}$ and $V_{IQQ}$ to generate the phase shift output signal $V_{Iout}$.

With this operation, the phase and/or amplitude deviations from preset values in the phase shifters 10A and 20 are corrected.

A phase shifter 13 of the phase shifter 10B shifts the phase of the signal $V_Q$ through 45° clockwise in FIG. 16 at the point of the center frequency to obtain the signal $V_{QI}$.

A phase shifter 14 of the phase shifter 10B shifts the phase of the signal $V_Q$ through 45° counterclockwise in FIG. 16 at the point of the center frequency to obtain the signal $V_{QQ}$.

The phase difference between the signals $V_{QI}$ and $V_{QQ}$ is 90° and substantially constant regardless of the frequency of the signal $V_Q$. These signals, however, have different amplitudes.

In this embodiment, a phase shifter 23 of the phase shifter 40 shifts the phase of the signal $V_{QI}$ through 135° clockwise in FIG. 16 at the point of the center frequency to obtain the signal $V_{QIQ}$. As described above, this signal has a deviation.

In this embodiment, a phase shifter 24 of the phase shifter 40 shifts the phase of the signal $V_{QQ}$ through 45° clockwise at the point of the center frequency to obtain the signal $V_{QQI}$. This signal $V_{IQQ}$ is inverted to generate the signal $V_{-QQI}$.

This signal also has a phase deviation.

The adder 50 adds these signals $V_{QIQ}$ and $V_{-QQI}$ to generate the phase shift output signal $V_{Qout}$.

With this operation, the phase and/or amplitude deviations from preset values in the phase shifters 10B and 40 are corrected.

As a result, the phase shift output signals $V_{Iout}$ and $V_{Qout}$ have a phase difference of almost 0° and substantially the same amplitude, as is obvious from FIG. 16 as well.

That is, phase characteristics that exhibit an almost constant gain against changes in the frequencies of the input signals $V_I$ and $V_Q$ in a wide range and a substantial phase difference of 0° can be obtained.

[Seventh Embodiment]

As shown in FIG. 17, phase signals $V_{I0}$ and $V_{I90}$ respectively obtained by phase shifters 11 and 12 constituting a phase shifter 10A may be added by an adder 61 to obtain a signal $V_{II}$, phase signals $V_{-I0}$ and $V_{I90}$ respectively obtained by the phase shifters 11 and 12 may be added to by an adder 71 to obtain a signal $V_{IQ}$, phase signals $V_{Q0}$ and $V_{Q90}$ respectively obtained by phase shifters 13 and 14 constituting a phase shifter 10B may be added by an adder 62 to obtain a signal $V_{QQ}$, and phase signals $V_{Q0}$ and $V_{-Q90}$ respectively obtained by the phase shifters 13 and 14 may be added by an adder 72 to obtain a signal $V_{QI}$.

In this case, the phase shifter 10A includes the adders 61 and 71, and the phase shifter 10B includes the adders 62 and 72.

FIG. 18 shows a vector diagram in a case wherein type I phase shifters are used as the phase shifters 10A and 10B, and type II phase shifters are used as the phase shifters 20 and 40.

[Eighth Embodiment]

Figure 19:
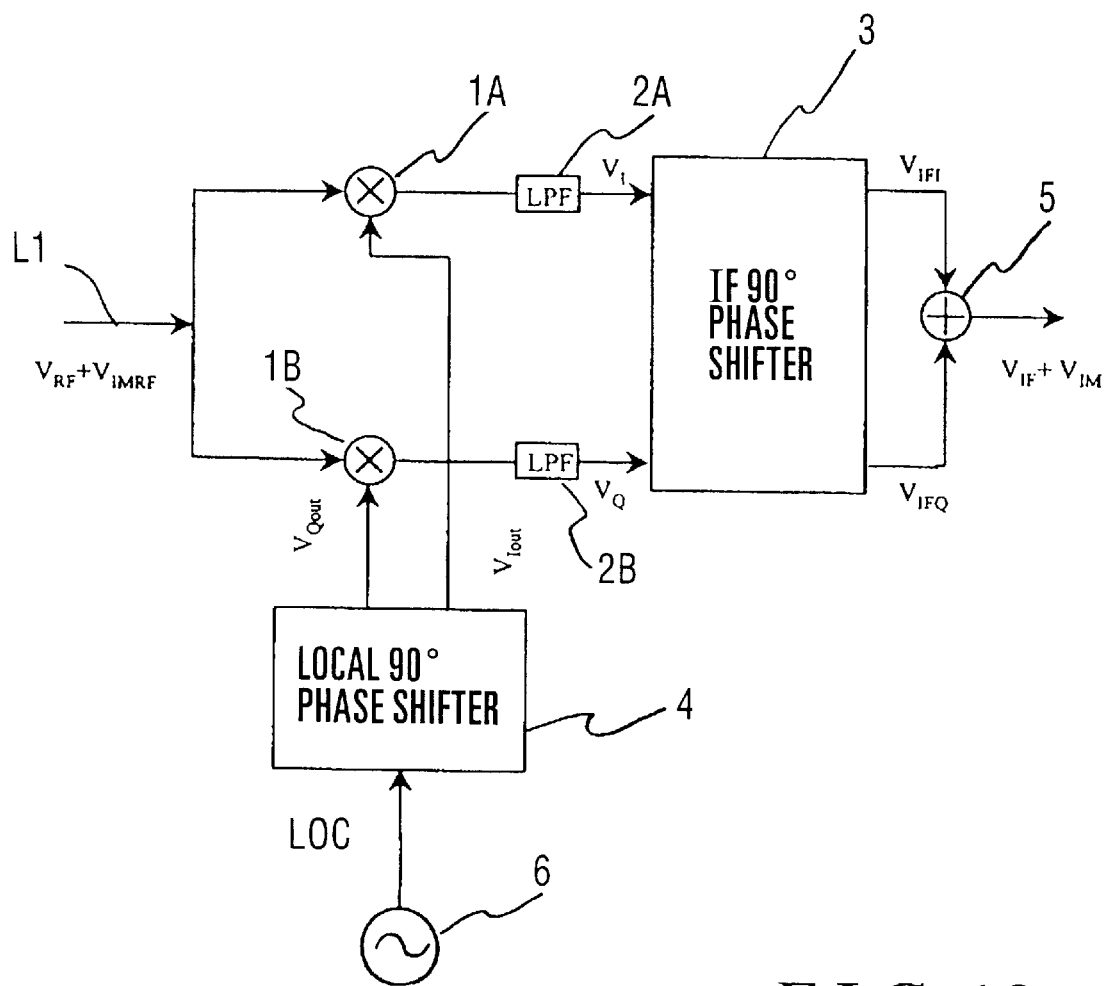
FIG. 19 is a block diagram showing an image rejection mixer according to the eighth embodiment of the present invention.

FIG. 19 shows an example of the circuit of an image rejection mixer.

Referring to FIG. 19, reference numerals 1A and 1B denote mixers; 2A and 2B, low-pass filters; 3, an IF phase shifter (phase shifting device); 4, a local phase shifter (oscillation circuit); 5, an adder; and 6, an oscillator. In this embodiment, one of the phase shifters described in the first to fifth embodiments is used as the local phase shifter 4, and one of the phase shifters described in the sixth and seventh embodiments is used as an IF phase shifter.

In this image rejection mixer, an RF signal including an IM signal from an input line L1 is divided into first and second in-phase RF signals, and the first and second RF signals are respectively input to mixers 1A and 1B.

A LOC signal from the oscillator 6 is supplied to the local phase shifter 4. The local phase shifter 4 receives the LOC signal from the oscillator 6 as an input signal and shifts its phase to generate phase shift output signals $V_{Iout}$ and $V_{Qout}$. The signals $V_{Iout}$ and $V_{Qout}$ are respectively sent to the mixers 1A and 1B.

In this case, the phase shift output signals $V_{Iout}$ and $V_{Qout}$ have a phase difference of 90° and substantially the same amplitude.

The mixer 1A mixes the first RF signal with the phase shift output signal $V_{Iout}$ from the local phase shifter 4 to convert the RF signal into a first intermediate-frequency (IF) signal having a frequency equal to the frequency difference between the first RF signal and phase shift output signal $V_{Iout}$, and sends it to the IF phase shifter 3 through the low-pass filter 2A.

The mixer 1B mixes the second RF signal with the phase shift output signal $V_{Qout}$ from the local phase shifter 4 to convert the RF signal into a second intermediate-frequency (IF) signal having a frequency equal to the frequency difference between the second RF signal and phase shift output signal $V_{Qout}$, and sends it to the IF phase shifter 3 through the low-pass filter 2B.

The IF phase shifter 3 phase-shifts the first IF signal from the low-pass filter 2A into a signal $V_I$ and the second IF signal from the low-pass filter 2B into a signal $V_Q$ to generate phase shift output signals $V_{IFI}$ and $V_{IFQ}$, and send them to the adder 5.

In this case, the phase shift output signals have a phase difference of almost 0° and substantially the same amplitude.

An IM signal is included in the signal $V_I$ as a signal in-phase with the signal $V_I$, whereas an IM signal is included in the signal $V_Q$ as an opposite-phase component to the signal $V_Q$. When, therefore, the signals $V_{IFI}$ and $V_{IFQ}$ are added by the adder 5, an IF signal from which the IM signals are removed can be obtained.

Referring to FIG. 19, reference symbol VIF denotes an IF signal component; and VIM, an IM signal component. FIG. 20 shows the output state of VIM in the form of a vector diagram.

As has been described above, the present invention includes a first phase shifter for receiving an input signal and obtaining first and second intermediate phase shift signals having different phases and a second phase shifter for further shifting the phases of the first and second intermediate phase shift signals to obtain first and second outputs. In this arrangement, the first and second outputs from the second phase shifter are added to obtain an output signal whose phase is shifted from the phase of the input signal by a predetermined amount. With this operation, phase differences and/or amplitude deviations from desired values cancel out each other, thus obtaining phase shift characteristics resistant to the influences of a deviation of the input signal frequency from the center frequency or variations in constituent element constants from design values.

What is claimed is:

1. A phase shift circuit comprising:

a first phase shifter for receiving an input signal and obtaining first and second intermediate phase shift signals having different phases;

a second phase shifter for obtaining first and second outputs by shifting phases of the first and second intermediate phase shift signals; and an adder for generating a phase shift output signal by adding the first and second outputs from said second phase shifter, wherein each of said first and second phase shifters comprises either a first type phase shifter exhibiting a substantially constant relative phase difference between input and output signals with respect to changes in input signal frequency in a wide range, and a frequency-dependent relative gain or a second type phase shifter exhibiting a substantially constant relative gain of input and output signals with respect to changes in input signal frequency in a wide range, and a frequency-dependent relative phase difference.

2. A phase shifting device comprising:

a first phase shifter for receiving an input signal and obtaining first and second intermediate phase shift signals having different phases;

a second phase shifter for obtaining first and second outputs by shifting phases of the first and second intermediate phase shift signals;

a third phase shifter for obtaining third and fourth outputs by shifting phases of the first and second intermediate phase shift signals;

a first adder for generating a first phase shift output signal by adding the first and second outputs from said second phase shifter; and a second adder for generating a second phase shift output signal by adding the third and fourth outputs from said third phase shifter.

3. A device according to claim 2, wherein each of said first, second, and third phase shifters comprises either a first type phase shifter exhibiting a substantially constant relative phase difference between input and output signals with respect to changes in input signal frequency in a wide range, and a frequency-dependent relative gain or a second type phase shifter exhibiting a substantially constant relative gain of input and output signals with respect to changes in input signal frequency in a wide range, and a frequency-dependent relative phase difference.

4. A phase shifting device comprising:

a first phase shifter for receiving a first input signal and obtaining first and second intermediate phase shift signals having different phases;

a second phase shifter for obtaining first and second outputs by shifting phases of the first and second intermediate phase shift signals;

a first adder for generating a first phase shift output signal by adding the first and second outputs from said second phase shifter;

a third phase shifter for receiving a second input signal out of phase with the first input signal and obtaining third and fourth intermediate phase shift signals;

a fourth phase shifter for obtaining third and fourth outputs by further shifting phases of the third and fourth intermediate phase shift signals; and a second adder for generating a second phase shift output signal by adding the third and fourth outputs from said fourth phase shifter.

5. A device according to claim 4, wherein each of said first, second, third, and fourth phase shifters comprises either a first type phase shifter exhibiting a substantially constant relative phase difference between input and output signals with respect to changes in input signal frequency in a wide range, and a frequency-dependent relative gain or a second type phase shifter exhibiting a substantially constant relative gain of input and output signals with respect to changes in input signal frequency in a wide range, and a frequency-dependent relative phase difference.

6. An oscillation circuit comprising:

an oscillator for generating an oscillation signal having a predetermined frequency; and an oscillation circuit for receiving the oscillation signal from said oscillator and generating first and second phase shift output signals, said oscillation circuit including:

a first phase shifter for receiving an input signal and obtaining first and second intermediate phase shift signals having different phases;

a second phase shifter for obtaining first and second outputs by shifting phases of the first and second intermediate phase shift signals;

a third phase shifter for obtaining third and fourth outputs by shifting phases of the first and second intermediate phase shift signals;

a first adder for generating a first phase shift output signal by adding the first and second outputs from said second phase shifter; and a second adder for generating a second phase shift output signal by adding the third and fourth outputs from said third phase shifter.

7. A device according to claim 6, wherein each of said first, second, and third phase shifters comprises either a first type phase shifter exhibiting a substantially constant relative phase difference between input and output signals with respect to changes in input signal frequency in a wide range, and a frequency-dependent relative gain or a second type phase shifter exhibiting a substantially constant relative gain of input and output signals with respect to changes in input signal frequency in a wide range, and a frequency-dependent relative phase difference.

8. An image rejection mixer comprising:

a phase shifting device for receiving first and second input signals and generating first and second phase shift output signals; and a third adder for generating an output signal by adding the first and second phase shift output signals, said phase shifting device including:

a first phase shifter for receiving an input signal and obtaining first and second intermediate phase shift signals having different phases;

a second phase shifter for obtaining first and second outputs by shifting phases of the first and second intermediate phase shift signals; and a first adder for generating a first phase shift output signal by adding the first and second outputs from said second phase shifter;

a third phase shifter for receiving a second input signal out of phase with the first input signal and obtaining third and fourth intermediate phase shift signals;

a fourth phase shifter for obtaining third and fourth outputs by further shifting phases of the third and fourth intermediate phase shift signals; and a second adder for generating a second phase shift output signal by adding the third and fourth outputs from said fourth phase shifter.

9. A mixer according to claim 8, wherein each of said first, second, third, and fourth phase shifters comprises either a first type phase shifter exhibiting a substantially constant relative phase difference between input and output signals with respect to changes in input signal frequency in a wide range, and a frequency-dependent relative gain or a second type phase shifter exhibiting a substantially constant relative gain of input and output signals with respect to changes in input signal frequency in a wide range, and a frequency-dependent relative phase difference.

10. An image rejection mixer comprising:

an oscillator for generating an oscillation signal having a predetermined frequency;

an oscillation circuit for receiving the oscillation signal from said oscillator and generating first and second phase shift output signals;

a first mixer for obtaining a first intermediate-frequency signal by mixing an input radio-frequency signal with the first phase shift output signal from said oscillation circuit;

a second mixer for obtaining a second intermediate-frequency signal by mixing the radio-frequency signal with the second phase shift output signal from said oscillation circuit;

a phase shifting device for receiving the first and second intermediate-frequency signals and generating first and second intermediate-frequency phase shift output signals; and a fifth adder or generating an output signal by adding the first intermediate-frequency phase shift output signal with the second intermediate-frequency phase shift output signal, said oscillation circuit including:

a first phase shifter for receiving an input signal and obtaining first and second intermediate phase shift signals having different phases;

a second phase shifter for obtaining first and second outputs by shifting phases of the first and second intermediate phase shift signals; and a third phase shifter for obtaining third and fourth outputs by shifting phases of the first and second intermediate phase shift signals;

a first adder for generating a first phase shift output signal by adding the first and second outputs from said second phase shifter; and a second adder for generating a second phase shift output signal by adding the third and fourth outputs from said third phase shifter, and said phase shifting device including:

a fourth phase shifter for receiving the first intermediate-frequency signal and obtaining first and second intermediate phase shift signals having difference phases;

a fifth phase shifter for obtaining first and second outputs by further shifting phases of the first and second intermediate phase shift signals from said fourth phase shifter;

a third adder for generating a first intermediate-frequency phase shift output signal by adding the first and second outputs from said fifth phase shifter;

a sixth phase shifter for receiving the second intermediate-frequency signal and obtaining third and fourth phase shift signals having difference phases;

a seventh phase shifter for obtaining third and fourth outputs by further shifting phases of the third and fourth intermediate phase shift signals from said sixth phase shifter; and a fourth adder for generating a second intermediate-frequency phase shift output signal by adding the third and fourth outputs from said seventh phase shifter.

11. A mixer according to claim 10, wherein each of said first, second, third, fourth, fifth, sixth, and seventh phase shifters comprises either a first type phase shifter exhibiting a substantially constant relative phase difference between input and output signals with respect to changes in input signal frequency in a wide range, and a frequency-dependent relative gain or a second type phase shifter exhibiting a substantially constant relative gain of input and output signals with respect to changes in input signal frequency in a wide range, and a frequency-dependent relative phase difference.

12. A phase shift circuit, comprising:

a first phase shifting circuit that inputs an input signal, phase shifts said input signal by a first phase angle to produce a first intermediate phase signal, and phase shifts said input signal by a second phase angle to produce a second intermediate phase signal, wherein said first phase angle is different from said second phase angle;

a second phase shifting circuit that generates a first output signal by phase shifting said first intermediate phase signal by a third phase angle and that generates a second output signal by phase shifting said second intermediate phase signal by a fourth phase angle, wherein said third phase angle is different from said fourth phase angle; and a third phase shifting circuit that generates a third output signal by phase shifting said first intermediate phase signal by a fifth phase angle and that generates a fourth output signal by phase shifting said second intermediate phase signal by a sixth phase angle, wherein said fifth phase angle is different from said sixth phase angle.

13. The phase shift circuit as claimed in claim 12, further comprising:

a first adder that adds said first output signal and said second output signal to produce a first phase shift output signal; and a second adder that adds said third output signal and said fourth output signal to produce a second phase shift output signal.

14. The phase shift circuit as claimed in claim 12, wherein said first phase angle substantially equals $\Psi$ and said second phase angle substantially equals $-\Psi$.

15. The phase shift circuit as claimed in claim 14, wherein said third phase angle substantially equals $\Psi$ and said fourth phase angle substantially equals $\Psi+\theta$, and wherein $\theta$ is different from $\Psi$.

16. The phase shift circuit as claimed in claim 15, wherein θ substantially equals 90°.

17. The phase shift circuit as claimed in claim 16, wherein Ψ substantially equals 45°.

18. The phase shift circuit as claimed in claim 15, wherein said fifth phase angle substantially equals Ψ+θ and said sixth phase angle substantially equals Ψ+φ, and wherein θ, Ψ, and φ are different from each other.

19. The phase shift circuit as claimed in claims 18, wherein θ substantially equals 90° and φ substantially equals 180°.

20. The phase shift circuit as claimed in claim 14, wherein said fifth phase angle substantially equals −Ψ and said sixth phase angle substantially equals Ψ.

21. The phase shift circuit as claimed in claim 14, wherein said third phase angle substantially equals Ψ and said fourth phase angle substantially equals −Ψ+φ, wherein Ψ and φ are different from each other.

22. The phase shift circuit as claimed in claim 21, wherein φ substantially equals 180°.

23. The phase shift circuit as claimed in claim 21, wherein said fifth phase angle substantially equals −Ψ and said sixth phase angle substantially equals Ψ.

24. The phase shift circuit as claimed in claim 12, wherein said first phase angle substantially equals Ψ and said second phase angle substantially equals Ψ+θ, and wherein θ is different from Ψ.

25. The phase shift circuit as claimed in claim 24, wherein θ substantially equals 90°.

26. The phase shift circuit as claimed in claim 24, wherein Ψ substantially equals 45°.

27. The phase shift circuit as claimed in claim 24, wherein said third phase angle substantially equals Ψ and said fourth phase angle substantially equals −Ψ.

28. The phase shift circuit as claimed in claim 24, wherein said fifth phase angle substantially equals −Ψ+φ and said sixth phase angle substantially equals Ψ, and wherein θ, Ψ, and φ are different from each other.

29. The phase shift circuit as claimed in claim 28, wherein said third phase angle substantially equals Ψ and said fourth phase angle substantially equals −Ψ.

30. The phase shift circuit as claimed in claim 29, wherein θ substantially equals 90° and φ substantially equals 180°.

31. The phase shift circuit as claimed in claim 24, wherein said third phase angle substantially equals Ψ and said fourth phase angle substantially equals Ψ+θ+φ, and wherein θ, Ψ, and φ are different from each other.

32. The phase shift circuit as claimed in claim 31, wherein θ substantially equals 90° and φ substantially equals 180°.

33. The phase shift circuit as claimed in claim 24, wherein said fifth phase angle substantially equals Ψ+θ and said sixth phase angle substantially equals Ψ.

34. The phase shift circuit as claimed in claim 33, wherein said third phase angle substantially equals Ψ and said fourth phase angle substantially equals Ψ+θ+φ, and wherein θ, Ψ, and φ are different from each other.

35. The phase shift circuit as claimed in claim 34, wherein θ substantially equals 90° and φ substantially equals 180°.

36. The phase shift circuit as claimed in claim 35, wherein Ψ substantially equals 45°.

37. A phase shift circuit, comprising:

a first phase shifting circuit that inputs a first input signal, phase shifts said first input signal by a first phase angle to produce a first intermediate phase signal, and phase shifts said first input signal by a second phase angle to produce a second intermediate phase signal, wherein said first phase angle is different from said second phase angle; and a second phase shifting circuit that generates a first output signal by phase shifting said first intermediate phase signal by a third phase angle and that generates a second output signal by phase shifting said second intermediate phase signal by a fourth phase angle, wherein said third phase angle is different from said fourth phase angle.

38. The phase shift circuit as claimed in claim 37, further comprising:

a first adder that adds said first output signal and said second output signal to produce a first phase shift output signal.

39. The phase shift circuit as claimed in claim 37, further comprising:

a third phase shifting circuit that inputs a second input signal, phase shifts said second input signal by a fifth phase angle to produce a third intermediate phase signal, and phase shifts said second input signal by a sixth phase angle to produce a fourth intermediate phase signal, wherein said fifth phase angle is different from said sixth phase angle; and a fourth phase shifting circuit that generates a third output signal by phase shifting said third intermediate phase signal by a seventh phase angle and that generates a fourth output signal by phase shifting said fourth intermediate phase signal by an eighth phase angle, wherein said seventh phase angle is different from said eight phase angle.

40. The phase shift circuit as claimed in claim 39, further comprising:

a first adder that adds said first output signal and said second output signal to produce a first phase shift output signal; and a second adder that adds said third output signal and said fourth output signal to produce a second phase shift output signal.

* * * * *